(12) United States Patent
Isopoussu

(10) Patent No.: US 11,620,497 B2
(45) Date of Patent: Apr. 4, 2023

(54) ARTIFICIAL NEURAL NETWORKS

(71) Applicant: Nokia Technologies Oy, Espoo (FI)

(72) Inventor: Anton Isopoussu, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 958 days.

(21) Appl. No.: 16/416,751

(22) Filed: May 20, 2019

(65) Prior Publication Data

US 2019/0370636 A1    Dec. 5, 2019

(30) Foreign Application Priority Data

May 29, 2018    (EP) .................................. 18174918

(51) Int. Cl.
  *G06N 3/04* (2006.01)
  *G06F 9/50* (2006.01)
  *H03M 7/30* (2006.01)
  *H04B 1/00* (2006.01)

(52) U.S. Cl.
  CPC .......... *G06N 3/0454* (2013.01); *G06F 9/5077* (2013.01); *H03M 7/607* (2013.01); *H04B 1/0003* (2013.01)

(58) Field of Classification Search
  CPC .... G06N 3/0454; G06F 9/5077; H03M 7/607; H04B 1/0003
  See application file for complete search history.

(56) References Cited

U.S. PATENT DOCUMENTS 5,134,396 A  *  7/1992 Sirat ....................... G06T 9/002
                                                         341/51
7,295,608 B2    11/2007 Reynolds et al.
7,660,774 B2    2/2010 Mukherjee et al.
8,326,781 B2    12/2012 Kugler
9,153,230 B2    10/2015 Maaninen
(Continued)

FOREIGN PATENT DOCUMENTS

CN    106027809 A    10/2016
KR    101729189 B1    4/2017
(Continued)

OTHER PUBLICATIONS

Office action received for corresponding European Patent Application No. 18174918.5, dated Jan. 11, 2022, 8 pages.
Dorner et al., "Deep Learning-Based Communication Over the Air", IEEE Journal of Selected Topics in Signal Processing, vol. 12, No. 1, 2017, pp. 1-11.
(Continued)

*Primary Examiner* — Eric T Oberly
(74) *Attorney, Agent, or Firm* — Mintz Levin Cohn Ferris Glovsky and Popeo, P.C.

(57) ABSTRACT

An apparatus that operates in a first mode of operation to enable performance of a first predetermined task to transfer data via a transmitter device to a receiver device across a first communication channel using a first artificial neural network, wherein the first artificial neural network is partitioned to the transmitter device and the receiver device, and operate in a second mode of operation to enable performance of a second predetermined task to transfer data via the transmitter device to the receiver device across a second communication channel using a second artificial neural network, wherein the second artificial neural network is partitioned to the transmitter device and the receiver device, and determine to operate the apparatus in the first mode or the second mode.

20 Claims, 4 Drawing Sheets

(56) References Cited

U.S. PATENT DOCUMENTS

| | | | |
|---|---|---|---|
| 9,295,423 | B2 | 3/2016 | Sethi |
| 10,652,565 | B1* | 5/2020 | Zhang .................. H04N 19/463 |
| 2013/0070935 | A1* | 3/2013 | Hui ..................... G10L 21/0216 |
| | | | 381/71.1 |
| 2015/0206050 | A1* | 7/2015 | Talathi ..................... G06N 3/08 |
| | | | 706/15 |
| 2015/0338917 | A1 | 11/2015 | Steiner et al. |
| 2016/0099008 | A1 | 4/2016 | Barker et al. |
| 2016/0192073 | A1 | 6/2016 | Poornachandran et al. |
| 2016/0232440 | A1 | 8/2016 | Gregor et al. |
| 2017/0011738 | A1 | 1/2017 | Senior et al. |
| 2017/0076195 | A1 | 3/2017 | Yang et al. |
| 2017/0154033 | A1 | 6/2017 | Lee |
| 2017/0251295 | A1 | 8/2017 | Pergament et al. |
| 2017/0311095 | A1 | 10/2017 | Fitz et al. |
| 2017/0339484 | A1 | 11/2017 | Kim |
| 2018/0144621 | A1* | 5/2018 | Arai ..................... G08G 1/0133 |
| 2019/0228284 | A1* | 7/2019 | Holland ............... G06V 20/582 |
| 2019/0319659 | A1* | 10/2019 | Calabro .................. G06N 3/08 |
| 2019/0348020 | A1* | 11/2019 | Clark ..................... G10L 13/047 |

FOREIGN PATENT DOCUMENTS

| | | |
|---|---|---|
| WO | 2016/070188 A1 | 5/2016 |
| WO | 2017/136083 A1 | 8/2017 |
| WO | 2017/152991 A1 | 9/2017 |
| WO | 2017/184277 A1 | 10/2017 |

OTHER PUBLICATIONS

Kumsawat et al., "A New Optimum Signal Compression Algorithm Based on Neural Networks for WSN", Proceedings of the World Congress on Engineering, vol. 1, WCE, Jul. 1-3, 2015, 6 pages.

Nachmani et al., "Deep Learning Methods for Improved Decoding of Linear Codes", IEEE Journal of Selected Topics in Signal Processing, vol. 12, No. 1, 2018, pp. 1-13.

Jaderberg et al., "Decoupled Neural Interfaces using Synthetic Gradients", arXiv, Jul. 3, 2017, 20 pages.

Lu et al., "A Study of the Recurrent Neural Network Encoder-decoder for Large Vocabulary Speech Recognition", 16th Annual Conference of the International Speech Communication Association, 2015, 6 pages.

Plakias et al., "Exploiting the Use of Auto Encoder and Recurrent Neural Networks for Robust to Noise Control", 25th Mediterranean Conference on Control and Automation (MED), Jul. 3-6, 2017, pp. 553-588.

Lu et al., "On Training the Recurrent Neural Network Encoder-Decoder for Large Vocabulary End-To-End Speech Recognition", IEEE International Conference on Acoustics, Speech and Signal Processing (ICASSP), Mar. 20-25, 2016, 5 pages.

Krause et al., "Context-Aware Mobile Computing: LearningContext-Dependent Personal Preferences from a Wearable Sensor Array", IEEE Transactions on Mobile Computing, vol. 5, No. 2, Feb. 2006, pp. 1-15.

Extended European Search Report received for corresponding European Patent Application No. 18174918.5, dated Oct. 22, 2018, 9 pages.

* cited by examiner

ARTIFICIAL NEURAL NETWORKS

TECHNOLOGICAL FIELD

Embodiments of the present disclosure relate to artificial neural networks (ANN). Some embodiments relate to apparatuses, some to methods, and some to computer programs.

BACKGROUND

Machine learning is a field of computer science that gives computers the ability to learn without being explicitly programmed. The system learns from experience E with respect to some class of tasks T and performance measure P if its performance at tasks in T, as measured by P, improves with experience E. The system can often learn from prior training data to make predictions on future data. Machine learning includes wholly or partially supervised learning and wholly or partially unsupervised learning. It may enable discreet outputs (for example classification, clustering) and continuous outputs (for example regression). Machine learning may for example be implemented using different approaches such as cost function minimization, neural networks, support vector machines and Bayesian networks for example.

An artificial neural network, for example with one or more hidden layers, models a complex relationship between input vectors and output vectors.

An artificial neural network comprises a number of highly interconnected processing elements (artificial neurons) that process information by their dynamic state response to external inputs. An artificial neural network is arranged as a directed graph whose nodes are artificial neurons and whose vertices are connections between artificial neurons.

Each neuron can be configured to determine whether or not a weighted sum of its inputs causes an activation function to produce an output. In a layered ANN, an input layer is the first layer and receives at least some of its inputs from outside the ANN and an output layer is the final layer and provides at least some of its outputs outside the ANN. The layers between the first and final layer are hidden layers. For artificial neurons in the hidden layer(s) and the final layer, the inputs are outputs from the artificial neurons in the preceding layer.

BRIEF SUMMARY

According to various, but not necessarily all, embodiments there is provided an apparatus comprising means for operating in a first mode of operation that enables performance of a first predetermined task by transferring data from a transmitter device to a receiver device using a first artificial neural network, wherein the first artificial neural network is:

partitioned to the transmitter device and the receiver device across a first communication channel between the transmitter device and the receiver device, and comprises a first part of the first artificial neural network in the transmitter device and a second part of the first artificial neural network in the receiver device;

operating in a second mode of operation that enables performance of a second predetermined task by transferring data from the transmitter device to the receiver device using a second artificial neural network, wherein the second artificial neural network is:

partitioned to the transmitter device and the receiver device across a second communication channel between the transmitter device and the receiver device, and comprises a first part of the second artificial neural network in the transmitter device and a second part of the second artificial neural network in the receiver device; and determining to operate in the first mode or the second mode.

The first mode of operation and the second mode of operation are different modes of operation. The first predetermined task and the second predetermined task are different tasks. The first artificial neural network and the second artificial neural network are different artificial neural networks. The first communication channel and the second communication channel are logically different channels and they may use separate physical channels or they may share a common physical channel.

In some but not necessarily all examples, the apparatus is configured for mode-dependent compression, wherein the first artificial neural network is configured to perform a first compression on input data and the second artificial neural network is configured to perform a second compression on input data, different to the first compression.

In some but not necessarily all examples, the compression is a compression for a first communications protocol and/or compression for a first task at the receiver device, and wherein the second compression is a compression for a second communications protocol and/or compression for a second task at the receiver device.

In some but not necessarily all examples, the first part of the first artificial neural network is dependent upon a bandwidth of the first communication channel and/or is dependent upon a communications protocol used for communicating via the first communication channel. In some but not necessarily all of these examples, the number of neurons in the first part is dependent upon a bandwidth of the first communication channel.

In some but not necessarily all examples, a final hidden part of the first part of the first artificial neural network is dependent upon a bandwidth of the first communication channel and/or is dependent upon a communications protocol used for communicating via the first communication channel.

In some but not necessarily all examples, the first part of the first artificial neural network has a first hidden part that in use provides data to the first communication channel, the second part of first artificial neural network has a second hidden part that in use receives data from the first communication channel, and wherein the number of neurons in the first hidden part is dependent upon a bandwidth of the first communication channel.

In some but not necessarily all examples, a decision to select to operate in the first mode or the second mode based on input sensor data.

In some but not necessarily all examples, determining to operate in the first mode or the second mode occurs contemporaneously at the transmitter device and the receiver device so that modes are co-ordinated.

In some but not necessarily all examples, a decision to select to operate in the first mode or the second mode is made at the receiver device and communicated to the transmitter device.

In some but not necessarily all examples, data input to the first artificial neural network and data input to the second artificial neural network is from one or more sensors In some but not necessarily all examples, data input to the first artificial neural network and data input to the second artificial neural network is audio data from the same one or more microphones.

In some but not necessarily all examples, data input to the first artificial neural network receives first pre-processing and data input to the second artificial neural network receives second pre-processing, different to the first pre-processing.

In some but not necessarily all examples, the apparatus is configured as a wireless headphone device or a device for communicating with a wireless headphone device.

In some but not necessarily all examples, data transferred from the first part of the first artificial neural network to the second part of the first artificial neural network is encoded by the first part of the first artificial neural network before transfer and decoded by the second part by the second part of the first artificial neural network after transfer and/or wherein data transferred from the first part of the second artificial neural network to the second part of the second artificial neural network is encoded by the first part of the second artificial neural network before transfer and decoded by the second part by the second part of the first artificial neural network after transfer.

In some but not necessarily all examples, data transferred from the first part of the first artificial neural network across the first communication channel to the second part of the first artificial neural network is encoded by the first part of the first artificial neural network before transfer and decoded by the second part by the second part of the first artificial neural network after transfer and/or wherein data transferred from the first part of the second artificial neural network across the second communication channel to the second part of the second artificial neural network is encoded by the first part of the second artificial neural network before transfer and decoded by the second part by the second part of the first artificial neural network after transfer.

In some but not necessarily all examples, at least the first artificial neural network is a recurrent network.

In some but not necessarily all examples, at least the first artificial neural network is adaptive to computational limitations of the transmitter device and/or receiver device.

In some but not necessarily all examples, (i) the first part of the first artificial neural network and the second part of the first artificial neural network are jointly trained as a single artificial neural network and/or the first part of the second artificial neural network and the second part of the second artificial neural network are jointly trained as a single artificial neural network; and/or (ii) the first part of the first artificial neural network and the second part of the first artificial neural network are jointly trained as a single artificial neural network using back propagation and a static or differentiable model of the channel and/or the first part of the second artificial neural network and the second part of the second artificial neural network are jointly trained as a single artificial neural network using back propagation and a static or differentiable model of the channel; and/or (iii) the first part of the first artificial neural network and the second part of the first artificial neural network are jointly trained as a single artificial neural network by applying supervised learning using training data defining performance of the first predetermined task and/or the first part of the second artificial neural network and the second part of the second artificial neural network are jointly trained as a single artificial neural network by applying supervised learning using training data defining performance of the second predetermined task;

(iv) the first part of the first artificial neural network and the second part of the first artificial neural network are jointly trained as a single artificial neural network to compensate for errors arising in the first communication channel and/or the first part of the second artificial neural network and the second part of the second artificial neural network are jointly trained as a single artificial neural network to compensate for errors arising in the second communication channel; and/or (v) the first part of the first artificial neural network, the second part of the first artificial neural network and a first intermediate artificial neural network positioned between the first part of the first artificial neural network and the second part of the first artificial neural network and simulating errors arising from the first communication channel, are jointly trained as a single artificial neural network to compensate for errors arising in the first communication channel, wherein the first part of the first artificial neural network and the second part of the first artificial neural network, but not the first intermediate artificial neural network, are used as the first artificial neural network, and/or the first part of the second artificial neural network, the second part of the second artificial neural network and a second intermediate artificial neural network positioned between the first part of the second artificial neural network and the second part of the second artificial neural network and simulating errors arising from the second communication channel, are jointly trained as a single artificial neural network to compensate for errors arising in the second communication channel, wherein the first part of the second artificial neural network and the second part of the second artificial neural network, but not the second intermediate artificial neural network, are used as the second artificial neural network.

In some but not necessarily all examples, the first part of the first artificial neural network and the second part of the first artificial neural network are jointly trained as a single artificial neural network to compensate for errors arising in communication between the first part of the first artificial neural network and the second part of the first artificial neural network and/or the first part of the second artificial neural network and the second part of the second artificial neural network are jointly trained as a single artificial neural network to compensate for errors arising in communication between the first part of the second artificial neural network and the second part of the second artificial neural network.

According to various, but not necessarily all, embodiments there is provided a method comprising:
determining to operate in the first mode or the second mode;
if determining to operate in the first mode, enabling performance of a first predetermined task by transferring data from a transmitter device to a receiver device using a first artificial neural network, wherein the first artificial neural network is
partitioned to the transmitter device and the receiver device across a first communication channel between the transmitter device and the receiver device,
and
comprises a first part of the first artificial neural network in the transmitter device and a second part of the first artificial neural network in the receiver device; and
if determining to operate in the second mode, enabling performance of a second predetermined task by transferring data from the transmitter device to the receiver device using a second artificial neural network, wherein the second artificial neural network is:
partitioned to the transmitter device and the receiver device across a second communication channel between the transmitter device and the receiver device, and comprises a first part of the second artificial neural network in the transmitter device and a second part of the second artificial neural network in the receiver device.

In some but not necessarily all examples, the method comprises: training jointly the first part of the first artificial neural network and the second part of the first artificial neural network as a single artificial neural network and/or training jointly the first part of the second artificial neural network and the second part of the second artificial neural network as a single artificial neural network.

In some but not necessarily all examples, the method comprises: training jointly the first part of the first artificial neural network and the second part of the first artificial neural network as a single artificial neural network using back propagation and a static or differentiable model of the first communication channel and/or training jointly the first part of the second artificial neural network and the second part of the second artificial neural network as a single artificial neural network using back propagation and a static or differentiable model of the second communication channel.

In some but not necessarily all examples, the method comprises:
training jointly the first part of the first artificial neural network and the second part of the first artificial neural network as a single artificial neural network by applying supervised learning using training data defining performance of the first predetermined task and/or training jointly the first part of the second artificial neural network and the second part of the second artificial neural network as a single artificial neural network by applying supervised learning using training data defining performance of the second predetermined task.

In some but not necessarily all examples, the method comprises:
training jointly the first part of the first artificial neural network and the second part of the first artificial neural network as a single artificial neural network to compensate for errors arising in the first communication channel and/or training jointly the first part of the second artificial neural network and the second part of the second artificial neural network as a single artificial neural network to compensate for errors arising in the second communication channel.

In some but not necessarily all examples, the method comprises:
training jointly the first part of the first artificial neural network, the second part of the first artificial neural network and a first intermediate artificial neural network positioned between the first part of the first artificial neural network and the second part of the first artificial neural network and simulating errors arising from the first communication channel, as a single artificial neural network to compensate for errors arising in the first communication channel, wherein the first part of the first artificial neural network and the second part of the first artificial neural network, but not the first intermediate artificial neural network, are used as the first artificial neural network;
and/or
training jointly the first part of the second artificial neural network, the second part of the second artificial neural network and a second intermediate artificial neural network positioned between the first part of the second artificial neural network and the second part of the second artificial neural network and simulating errors arising from the second communication channel, as a single artificial neural network to compensate for errors arising in the second communication channel, wherein the first part of the second artificial neural network and the second part of the second artificial neural network, but not the second intermediate artificial neural network, are used as the second artificial neural network.

According to various, but not necessarily all, embodiments there is provided an apparatus comprising:
at least one processor; and
at least one memory including computer program code
the at least one memory and the computer program code configured to, with the at least one processor, cause the apparatus at least to perform:
determining to operate in the first mode or the second mode;
if determining to operate in the first mode, enabling performance of a first predetermined task by transferring data from a transmitter device to a receiver device using a first artificial neural network, wherein the first artificial neural network is
  partitioned to the transmitter device and the receiver device across a first communication channel between the transmitter device and the receiver device,
and
  comprises a first part of the first artificial neural network in the transmitter device and a second part of the first artificial neural network in the receiver device; and
if determining to operate in the first mode, enabling performance of a second predetermined task by transferring data from the transmitter device to the receiver device using a second artificial neural network, wherein the second artificial neural network is:
  partitioned to the transmitter device and the receiver device across a second communication channel between the transmitter device and the receiver device, and
  comprises a first part of the second artificial neural network in the transmitter device and a second part of the second artificial neural network in the receiver device.

According to various, but not necessarily all, embodiments there is provided an apparatus comprising means for operating a transmitter device in a first mode of operation that enables performance of a first predetermined task by using, at the transmitter device, a first part of a first partitioned artificial neural network to transmit input data from the transmitter device to a receiver device using the first partitioned artificial neural network;
operating the transmitter device in a second mode of operation that enables performance of a second predetermined task by using, at the transmitter device, a first part of a second partitioned artificial neural network to transmit input data from the transmitter device to the receiver device using a second artificial neural network;
determining to operate in the first mode or the second mode of operation.

In some but not necessarily all examples, the first partitioned artificial neural network is partitioned to the transmitter device and the receiver device across a first communication channel between the transmitter device and the receiver device, and
comprises the first part of the first artificial neural network in the transmitter device and a second part of the first artificial neural network in the receiver device;

In some but not necessarily all examples, the second partitioned artificial neural network is partitioned to the transmitter device and the receiver device across a second communication channel between the transmitter device and the receiver device, and
comprises a first part of the second artificial neural network in the transmitter device and a second part of the second artificial neural network in the receiver device; and In some but not necessarily all examples, the apparatus is or comprises the transmitter device.

According to various, but not necessarily all, embodiments there is provided an apparatus comprising means for operating a receiver device in a first mode of operation that enables performance of a first predetermined task by using, at the receiver device, a second part of a first partitioned artificial neural network to receive data transmitted to the receiver device from a first part of the first partitioned artificial neural network at a transmitter device; operating the receiver device in a second mode of operation that enables performance of a second predetermined task by using, at the receiver device, a second part of a second partitioned artificial neural network to receive data transmitted to the receiver device from a first part of the first partitioned artificial neural network at a transmitter device; determining to operate in the first mode or the second mode of operation.

In some but not necessarily all examples, the first partitioned artificial neural network is partitioned to the transmitter device and the receiver device across a first communication channel between the transmitter device and the receiver device, and comprises the first part of the first artificial neural network in the transmitter device and a second part of the first artificial neural network in the receiver device;

In some but not necessarily all examples, the second partitioned artificial neural network is partitioned to the transmitter device and the receiver device across a second communication channel between the transmitter device and the receiver device, and comprises a first part of the second artificial neural network in the transmitter device and a second part of the second artificial neural network in the receiver device; and In some but not necessarily all examples, the apparatus is or comprises the receiver device.

Features described as features of an apparatus may be performed in a method.

Features described as features of a method apparatus may be performed in an apparatus, for example, by suitable means.

According to various, but not necessarily all, embodiments there is provided examples as claimed in the appended claims.

BRIEF DESCRIPTION

Some example embodiments will now be described with reference to the accompanying drawings in which.

DEFINITIONS

An "apparatus" is a physical entity. It may be a component or a combination of components.

"Means" references that part of a physical entity that perform a function. The part may be dedicated to that function or may perform other functions. The functionality can, for example, be included in hardware within circuits or included in software within instructions.

"Mode of operation" refers to a state of a state machine.

"Task" refers to a performed action.

"Transmitter device" is a physical entity or part of a physical entity that transmits data.

"Receiver device" is a physical entity or part of a physical entity that receives data.

"Artificial neural network" is a machine learning network comprising a number of highly interconnected processing elements (artificial neurons) that process information by their dynamic state response to inputs including inputs dependent upon the dynamic state response of interconnected artificial neurons. It can be, for example, a shallow neural network, deep neural network (DNN), a recurrent neural network (RNN), Convolutional neural network (CNN), a Generative adversarial network (GAN), a Capsule Neural Network (CapsNet), etc.

"Partition" means the physical division of an entity that operates as a whole into two physically separated entities.

"Communication channel" refers to the link used for communication and includes both physical links and wireless links "Communication pipeline" refers to the end to end communication of information.

DETAILED DESCRIPTION

Figure 1:
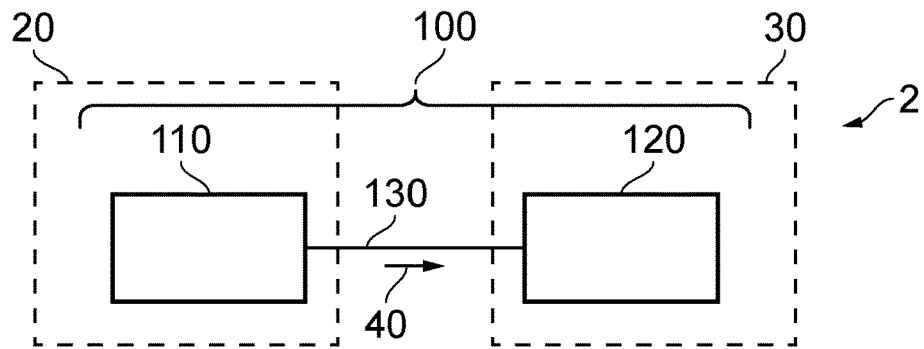
FIG. 1 shows an example embodiment of the subject matter described herein.
Figure 2:
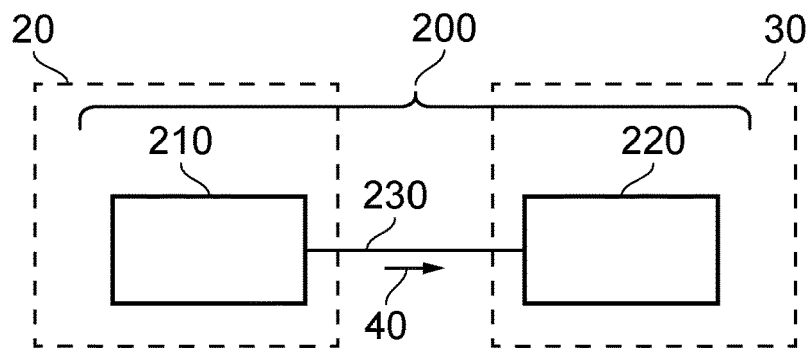
FIG. 2 shows another example embodiment of the subject matter described herein.

FIG. 1 illustrates an example embodiment of a system 2 operating in a first mode of operation and FIG. 2 illustrates an example embodiment of the system 2 operating in a second mode of operation.

In the first mode of operation, the system 2 enables performance of a first predetermined task by transferring data 40 from a transmitter device 20 to a receiver device 30 using a first artificial neural network 100.

The first artificial neural network 100 is partitioned to the transmitter device 20 and the receiver device 30 across a first communication channel 130 between the transmitter device 20 and the receiver device 30. The first artificial neural network 100 comprises a first part 110 of the first artificial neural network 100 that is in the transmitter device 20 and a second part 120 of the first artificial neural network 100 that is in the receiver device 30.

The first artificial neural network 100 is therefore physically divided into two different parts 110, 120 that are in communication via the communication channel 130. The first part 110 and the second part 120 of the first artificial neural network 100 operate together substantially simultaneously to provide the functionality of the first artificial neural network 100. The combination of the first artificial neural network 100 and the interconnecting first communication channel 130 provide a first communication pipeline from the transmitter device 20 to the receiver device 30.

FIG. 1 therefore illustrates an example of an apparatus comprising means for operating a transmitter device 20 in a first mode of operation that enables performance of a first predetermined task by using, at the transmitter device 20, a first part 110 of a first partitioned artificial neural network 100 to transmit data 40 from the transmitter device 20 to a receiver device 30 using the first partitioned artificial neural network 100.

The first partitioned artificial neural network 100 is partitioned to the transmitter device 20 and the receiver device 30 across the first communication channel 130 and comprises the first part 110 of the first artificial neural network 100 in the transmitter device 20 and a second part 120 of the first artificial neural network 100 in the receiver device 30.

The figure also illustrates an apparatus comprising means for operating a receiver device 30 in a first mode of operation that enables performance of the first predetermined task by using, at the receiver device 30, the second part 120 of the first partitioned artificial neural network 100 to receive data 40 transmitted to the receiver device 30 from the first part 110 of the first partitioned artificial neural network 100 at the transmitter device 20.

In some examples, the first predetermined task may be a task performed by only the receiver device 20, in other examples it may be a task performed by only the transmitter device 30 and in other examples it may be a task performed by both the transmitter device 20 and the receiver device 30 or caused to be performed by one or more of those devices.

FIG. 2 therefore illustrates an example of an apparatus comprising means for operating a transmitter device 20 in a second mode of operation that enables performance of a second predetermined task by using, at the transmitter device 20, a first part 210 of a second partitioned artificial neural network 200 to transmit data 40 from the transmitter device 20 to a receiver device 30 using the second partitioned artificial neural network 200.

The second partitioned artificial neural network 200 is partitioned to the transmitter device 20 and the receiver device 30 across a second communication channel 230 and comprises a first part 210 of the second artificial neural network 200 in the transmitter device 20 and a second part 220 of the second artificial neural network 200 in the receiver device 30.

The figure also illustrates an apparatus comprising means for operating the receiver device 30 in the second mode of operation that enables performance of the second predetermined task by using, at the receiver device 30, the second part 220 of the second partitioned artificial neural network 200 to receive data 40 transmitted to the receiver device 30 from the first part 210 of the second partitioned artificial neural network 200 at the transmitter device 20.

In some examples, the second predetermined task may be a task performed by only the receiver device 20, in other examples it may be a task performed by only the transmitter device 30 and in other examples it may be a task performed by both the transmitter device 20 and the receiver device 30 or caused to be performed by one or more of those devices.

Figure 3:
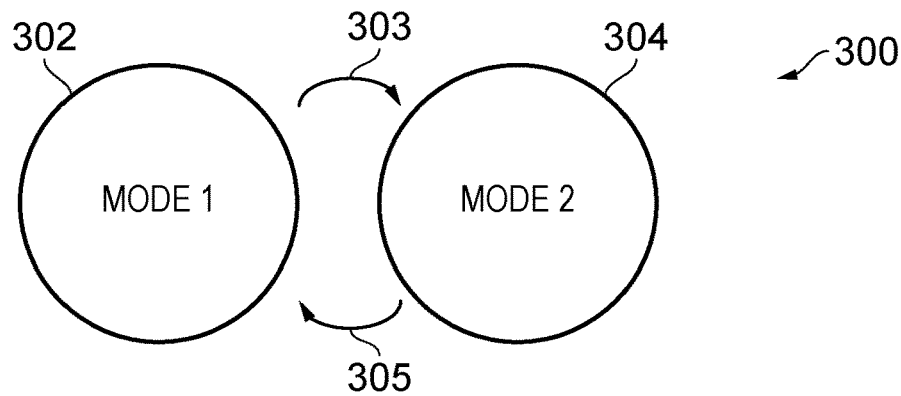
FIG. 3 shows an example embodiment of the subject matter described herein.

FIG. 3 illustrates an example embodiment of a method 300. In this example, the first mode of operation 302 is illustrated as a first state of a state machine and the second mode of operation 303 is illustrated as a second state of the state machine. The transition 303 from the first state to the second state causes a change in the mode of operation from the first mode 302 to the second mode 304. The transition 305 from the second state to the first state causes a change in the mode of operation from the second mode 304 to the first mode 302. The first and second modes are therefore mutually exclusive in this example.

It will be appreciated that in this example the state machine comprises only two states each of which corresponds to a particular mode. However, in other examples there may be multiple different states each with an associated mode of operation that uses a different partitioned artificial neural network. Each partitioned artificial neural network may enable performance of a different predetermined task by transferring data 40 from a first part in the transmitter device 20 to a second part in the receiver device 30 across a communication channel.

The method 300 comprises determining whether to operate in a particular state of the state machine. For example, determining whether to operate in the first mode of operation 302 or the second mode of operation 304.

The decision of whether to operate in the first mode 302 or the second mode 304 may be taken in the receiver device 20 or in the transmitter device 30 or in both devices contemporaneously.

The method 300 therefore comprises:
determining to operate in the first mode 302 or the second mode 304;
if determining to operate in the first mode 302, enabling performance of a first predetermined task by transferring data 40 from a transmitter device 20 to a receiver device 30 using a first artificial neural network 100, wherein the first artificial neural network is partitioned to the transmitter device 20 and the receiver device 30 across a first communication channel 130 between the transmitter device 20 and the receiver device 30 and comprises a first part 110 of the first artificial neural network 100 in the transmitter device 20 and a second part 120 of the first artificial neural network 100 in the receiver device 30; and
if determining to operate in the second mode 304, enabling performance of a second predetermined task by transferring data 40 from the transmitter device 20 to the receiver device 30 using a second artificial neural network 200, wherein the second artificial neural network 200 is partitioned to the transmitter device 20 and the receiver device 30 across a second communication channel 230 between the transmitter device 20 and the receiver device 30, and comprises a first part 210 of the second artificial neural network 200 in the transmitter device 20 and a second part 220 of the second artificial neural network 200 in the receiver device 30.

An artificial neural network comprises a number of highly interconnected processing elements (artificial neurons) that process information by their dynamic state response to external inputs. An artificial neural network is arranged as a directed graph whose nodes are artificial neurons and whose vertices are connections between artificial neurons.

Each neuron can be configured to determine whether or not a weighted sum of its inputs causes an activation function to produce an output. In a layered ANN, an input layer is the first layer and receives at least some of its inputs from outside the ANN and an output layer is the final layer and provides at least some of its outputs outside the ANN. The layers between the first and final layer are hidden layers.

For artificial neurons in the hidden layer(s) and the final layer, the inputs are outputs from the artificial neurons in the preceding layer.

An artificial neural network can be defined in hardware using a hardware component for each neuron and physically interconnected the hardware components to form the artificial neural network. For example, each artificial neuron may be a different controller or other circuitry configured to perform the neuron's function.

An artificial neural network can be defined in software for example using Python, Matlab or Octave. For example, each artificial neuron may be simulated using programmed instructions that are executed by a controller.

Figure 4A:
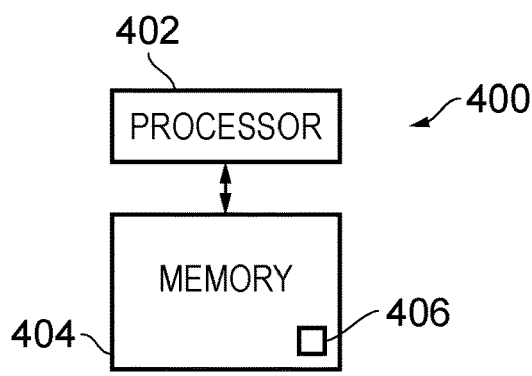
FIG. 4A shows another example embodiment of the subject matter described herein.

FIG. 4A illustrates an example embodiment of a controller 400. Implementation of a controller 400 may be as controller circuitry. The controller 400 may be implemented in hardware alone, have certain aspects in software including firmware alone or can be a combination of hardware and software (including firmware).

As illustrated in FIG. 4A the controller 400 may be implemented using instructions that enable hardware functionality, for example, by using executable instructions of a computer program 406 in a general-purpose or special-purpose processor 402 that may be stored on a computer readable storage medium (disk, memory etc) to be executed by such a processor 402.

The processor 402 is configured to read from and write to the memory 404. The processor 402 may also comprise an output interface via which data and/or commands are output by the processor 402 and an input interface via which data and/or commands are input to the processor 402.

The memory 404 stores a computer program 406 comprising computer program instructions (computer program code) that controls the operation of the apparatus 20, 30 when loaded into the processor 402. The computer program instructions, of the computer program 406, provide the logic and routines that enables the apparatus to perform the methods illustrated in FIG. 3. The processor 402 by reading the memory 404 is able to load and execute the computer program 406.

The apparatus 20, 30 therefore comprises:
at least one processor 402; and
at least one memory 404 including computer program code
the at least one memory 404 and the computer program code configured to, with the at least one processor 402, cause the apparatus 20, 30 at least to perform:
determining to operate in the first mode or the second mode;
if determining to operate in the first mode, enabling performance of a first predetermined task by transferring data from a transmitter device to a receiver device using a first artificial neural network, wherein the first artificial neural network is
 partitioned to the transmitter device and the receiver device across a first communication channel between the transmitter device and the receiver device, and
 comprises a first part of the first artificial neural network in the transmitter device and a second part of the first artificial neural network in the receiver device; and if determining to operate in the second mode, enabling performance of a second predetermined task by transferring data from the transmitter device to the receiver device using a second artificial neural network, wherein the second artificial neural network is:
 partitioned to the transmitter device and the receiver device across a second communication channel between the transmitter device and the receiver device, and
 comprises a first part of the second artificial neural network in the transmitter device and a second part of the second artificial neural network in the receiver device.

For transmitting, the at least one memory 404 and the computer program code configured to, with the at least one processor 402, cause an apparatus comprising a transmitter device at least to perform:
operating the transmitter device in a first mode of operation that enables performance of a first predetermined task by using, at the transmitter device, a first part of a first partitioned artificial neural network to transmit input data from the transmitter device to a receiver device using the first partitioned artificial neural network;
operating the transmitter device in a second mode of operation that enables performance of a second predetermined task by using, at the transmitter device, a first part of a second partitioned artificial neural network to transmit input data from the transmitter device to the receiver device using a second artificial neural network;
determining to operate in the first mode or the second mode of operation.

For receiving, the at least one memory 404 and the computer program code configured to, with the at least one processor 402, cause an apparatus comprising a receiver device at least to perform:
operating the receiver device in a first mode of operation that enables performance of a first predetermined task by using, at the receiver device, a second part of a first partitioned artificial neural network to receive data transmitted to the receiver device from a first part of the first partitioned artificial neural network at a transmitter device;
operating the receiver device in a second mode of operation that enables performance of a second predetermined task by using, at the receiver device, a second part of a second partitioned artificial neural network to receive data transmitted to the receiver device from a first part of the second partitioned artificial neural network at the transmitter device;
determining to operate in the first mode or the second mode of operation.

Figure 4B:
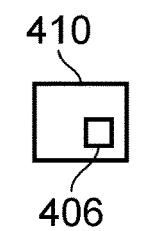
FIG. 4B shows an example embodiment of the subject matter described herein.

As illustrated in FIG. 4B, the computer program 406 may arrive at the apparatus 20, 30 via any suitable delivery mechanism 410. The delivery mechanism 410 may be, for example, a machine readable medium, a computer-readable medium, a non-transitory computer-readable storage medium, a computer program product, a memory device, a record medium such as a Compact Disc Read-Only Memory (CD-ROM) or a Digital Versatile Disc (DVD) or a solid state memory, an article of manufacture that comprises or tangibly embodies the computer program 406. The delivery mechanism may be a signal configured to reliably transfer the computer program 406. The apparatus 20, 30 may propagate or transmit the computer program 406 comprising computer program instructions (computer program code) as a computer data signal.

The computer program instructions are for causing an apparatus to perform at least the following:
operating a transmitter device in a first mode of operation that enables performance of a first predetermined task by using, at the transmitter device, a first part of a first partitioned artificial neural network to transmit input data from the transmitter device to a receiver device using the first partitioned artificial neural network;
operating the transmitter device in a second mode of operation that enables performance of a second predetermined task by using, at the transmitter device, a first part of a second partitioned artificial neural network to transmit input data from the transmitter device to the receiver device using a second artificial neural network;
determining to operate in the first mode or the second mode of operation,
and/or
operating a receiver device in a first mode of operation that enables performance of a first predetermined task by using, at the receiver device, a second part of a first partitioned artificial neural network to receive data transmitted to the receiver device from a first part of the first partitioned artificial neural network at a transmitter device;
operating the receiver device in a second mode of operation that enables performance of a second predetermined task by using, at the receiver device, a second part of a second partitioned artificial neural network to receive data transmitted to the receiver device from a first part of the first partitioned artificial neural network at a transmitter device;
determining to operate in the first mode or the second mode of operation.

The computer program instructions may be comprised in a computer program, a non-transitory computer readable medium, a computer program product, a machine readable medium. In some but not necessarily all examples, the computer program instructions may be distributed over more than one computer program.

Although the memory 404 is illustrated as a single component/circuitry it may be implemented as one or more separate components/circuitry some or all of which may be integrated/removable and/or may provide permanent/semi-permanent/dynamic/cached storage.

Although the processor 402 is illustrated as a single component/circuitry it may be implemented as one or more separate components/circuitry some or all of which may be integrated/removable. The processor 402 may be a single core or multi-core processor.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also one or more specialized circuits such as field-programmable gate arrays (FPGA), application specific circuits (ASIC), GPUs (Graphics Processing Unit), NPUs (Neural Network Processing Unit), AI (Artificial Intelligence) accelerators, signal processing devices, other processing circuitry, or any combinations thereof. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used in this application, the term 'circuitry' may refer to one or more or all of the following:
(a) hardware-only circuitry implementations (such as implementations in only analog and/or digital circuitry) and
(b) combinations of hardware circuits and software, such as (as applicable):
(i) a combination of analog and/or digital hardware circuit(s) with software/firmware and
(ii) any portions of hardware processor(s) with software (including digital signal processor(s)), software, and memory(ies) that work together to cause an apparatus, such as a mobile phone or server, to perform various functions and
(c) hardware circuit(s) and or processor(s), such as a microprocessor(s) or a portion of a microprocessor(s), that requires software (e.g. firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor and its (or their) accompanying software and/or firmware. The term circuitry also covers, for example and if applicable to the particular claim element, a baseband integrated circuit for a mobile device or a similar integrated circuit in a server, a cellular network device, or other computing or network device.

The blocks illustrated in the FIG. 3 may represent steps in a method and/or sections of code in the computer program 406. The illustration of a particular order to the blocks does not necessarily imply that there is a required or preferred order for the blocks and the order and arrangement of the block may be varied. Furthermore, it may be possible for some blocks to be omitted.

Figure 5:
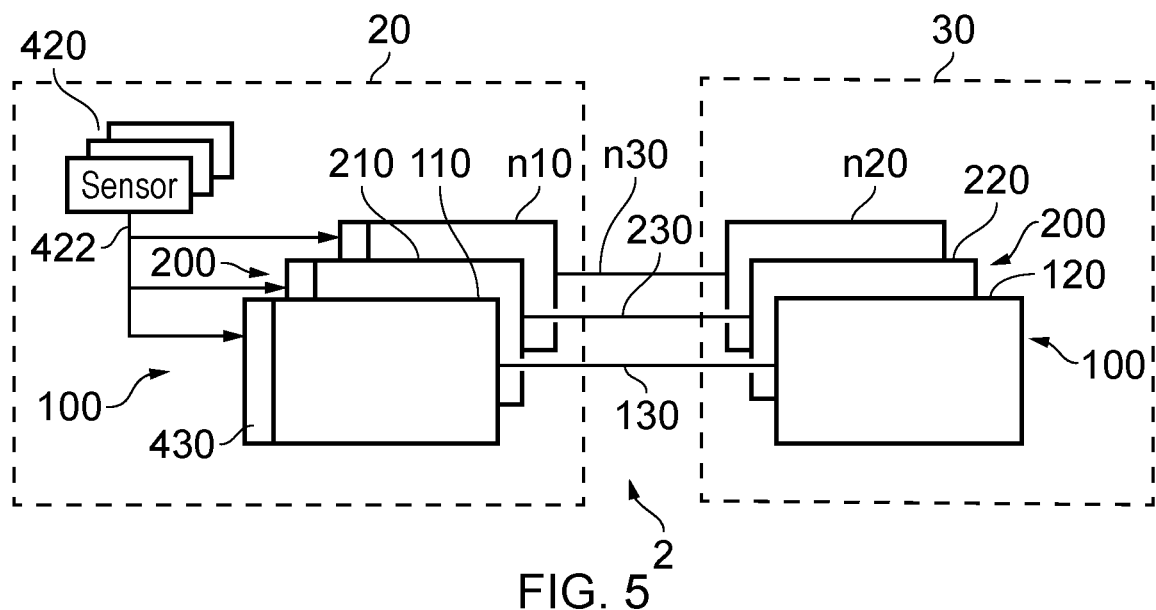
FIG. 5 shows another example embodiment of the subject matter described herein.

FIG. 5 illustrates an example embodiment of a system 2, as previously described with relation to FIGS. 1, 2, 3, 4A and 4B. A transmitter device 20 has a first mode of operation 302 that enables performance of a first predetermined task by using, at the transmitter device 20, a first part 110 of a first partitioned artificial neural network 100 to transmit data 40 from the transmitter device 20 to a receiver device 30 using the first partitioned artificial neural network.

The first partitioned artificial neural network 100 is partitioned to the transmitter device 20 and the receiver device 30 across a first communication channel 130 between the transmitter device 20 and the receiver device 30 and comprises the first part 110 of the first artificial neural network 100 in the transmitter device 20 and the second part of the first artificial neural network 100 in the receiver device 30.

The receiver device 30, in a first mode of operation 302, enables the performance of the first predetermined task by using, at the receiver 30, a second part 120 of the first partitioned artificial neural network 100 to receive data 40 transmitted to the receiver device 30 from the first part 110 of the first partitioned artificial neural network 100 at the transmitter device 20.

The transmitter device 20, in a second mode of operation 304, enables performance of a second predetermined task by using, at the transmitter device 20, a first part 210 of a second partitioned artificial neural network 200 to transmit data 40 from the transmitter device 20 to the receiver device 30 using the second partitioned artificial neural network 200.

The second partitioned artificial neural network 200 is partitioned to the transmitter device 20 and the receiver device 30 across a second communication channel 230 between the transmitter device 20 and the receiver device 30, and comprises the first part 210 of the second artificial neural network 200 in the transmitter device 20 and a second part 220 of the second artificial neural network 200 in the receiver device 30.

The receiver device 30, in the second mode of operation 304, enables performance of the second predetermined task by using, at the receiver device 30, a second part 220 of the second partitioned artificial neural network 200 to receive data 40 transmitted to the receiver device 30 from the first part 210 of the second partitioned artificial neural network 200 at the transmitter device 20.

In some but not necessarily all examples, the system 2 comprises one or more additional artificial neural networks for performing specific tasks that have a first part n10 partitioned to the transmitter device 20 and a second part n20 partitioned to the receiver device 30 and configured to receive data from the first part n10 transmitted in a communication channel n30.

The system 2 may operate in, at least, the first mode 302 or the second mode 304.

In this example, the transmitter device 20 comprises or is coupled to one or more sensors 420. The one or more sensors 420 produce output data 422 that is input, as input data 422, to the first part of the partitioned artificial neural network that has been selected according to the current mode of operation. In the first mode of operation 302, the data 422 from the one or more sensors 420 is provided to the first part 110 of the first partitioned artificial neural network 100. In the second mode of operation 304, the input data 422 is provided to the first part 210 of the partitioned artificial neural network 200.

The one or more sensors 420 that are used to provide the input data 422 in the first mode 302 may be the same or different to the one or more sensors 420 that are used to provide the input data 422 in the second mode of operation 304.

In some, but not necessarily all, examples, the input data 422 is audio data that is captured at one or more microphones 420. In this or other examples, respective input data 422 may be from the one or more of the sensors 420 such as: a still/video camera unit, an inertial measurement unit (IMU), a geolocation device such as a GPS (Global Positioning System) receiver, a proximity sensor, a barometer, a thermometer, a speed sensor, a radar, a LIDAR (Light Detection And Ranging), a user input device, a diagnostic or medical sensor, such as a PPG (Photoplethysmogram), an electromyographic (EMG) sensor, a pulse oximeter, or any combination thereof. Additionally, the input data 422 may be one or more of Electrocardiography data (ECG) and EEG data (electroencephalography) from one or more respective sensors 420.

In the example illustrated, but not necessarily all examples, the input data 422 is pre-processed at pre-processing circuitry 430 before it is input to the partitioned artificial neural network. In some examples, there may be no pre-processing. In other examples there may be different pre-processing applied before the first partitioned artificial neural network 100 and/or before the second partitioned artificial neural network 200. In some examples there may be pre-processing applied to one but not the other of the first and second partitioned artificial neural networks 100, 200. Many different types of pre-processing may be performed. One example of pre-processing is quantization or other signal shaping. Quantization may, for example, be performed by passing only the most significant bits of the input data 422.

The input data 422 is transferred from the transmitter device 20 to the receiver device 30 via a communication pipeline determined by the current mode of operation. If the current mode of operation is the first mode of operation 302, then the input data 422 is transferred via a first communication pipeline that comprises the first artificial neural network 100 partitioned by the first communication channel 130. If the current mode of operation is the second mode of operation 304, then the input data 422 is transferred via a second communication pipeline that comprises the second artificial neural network 200 partitioned by the second communication channel 230.

It will therefore be appreciated that the input data 422 is available at the transmitter device 20 and also at the receiver device 30. In some examples, the decision to select to operate in the first mode of operation 302 or the second mode of operation 304 is based upon the input data 422. As previously described, this decision may be taken at the transmitter device 20, the receiver device 30 or at both the transmitter device 20 and the receiver device 30.

The determination to operate in the first mode or the second mode occurs contemporaneously at the transmitter device 20 and the receiver device 30 so that the modes are coordinated. This ensures that the first and second parts of the artificial neural networks that are in communication relate to the same artificial neural network.

In some, but not necessarily all, examples, the decision to select to operate in the first mode 302 or the second mode 304 is made at the receiver device 30 and communicated to the transmitter device 20. In some, but not necessarily all, examples, this communication may be via a feedback channel, for example a separate low bandwidth wireless channel.

In some, but not necessarily all, examples, the data output from the first part of the partitioned artificial neural network may be encoded before it is transmitted on to the respective communication channel. This encoding may, for example, make the transmission of the data more robust to interference or noise. In one example, the data 40 transferred from the first part of the partitioned artificial neural network across the communication channel to the second part of that partitioned artificial neural network is encoded before transfer by the first part and decoded by the second part after transfer. In one example, the encoding may be performed by conjugate permutation, however, other types of encoding may be used, for example interleaving.

The encoding may be performed by the first part of the partitioned artificial neural network and decoded by the second part of the partitioned artificial neural network. In other examples, pre-processing may be used to encode data before it is provided to the first part of the partitioned artificial neural network.

The first partitioned artificial neural network 100 and/or the second partitioned artificial neural network 200 may use the same encoding/decoding or may use different encoding/decoding or may not use encoding/decoding.

The transmission and processing of input data 422 can be done on a single chip set at the transmitter device 20.

The reception and processing of data 40 can be done on a single chip set at the receiver device 30.

Figure 6:
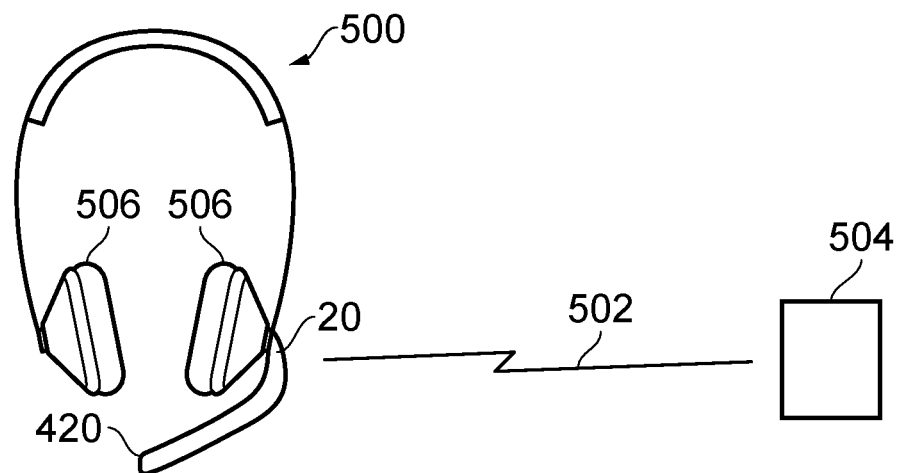
FIG. 6 shows an example embodiment of the subject matter described herein.

FIG. 6 illustrates an example embodiment of a wireless transmitter device 20, such as a headset device 500, e.g. a headphone device, earbuds, earphones, a virtual reality (VR) headset, or an augmented reality (AR) headset that is configured to communicate wirelessly 502 with a host device 504 which is configured to communicate wirelessly with the wireless headphone device 500. Alternatively or additionally, the wireless device 500 may be a wireless game controller, a sleeve control device or a wrist control device. Alternatively or additionally, the transmitter device 20 may be an IoT device embedded with, or connected to, one or more sensor devices 420.

In this example, the wireless headphone device 500 may be or may comprise the transmitter device 20 and the host device 504 may be or may comprise the receiver device 30. The combination of the wireless headphone device 500 and the host device 504 therefore provides a system 2 as previously described. In some other examples, the IoT device 20 may be connected to the host device 504, for example, an intermediary device 30 (such as a mobile communication device, a mobile phone, a gateway, a router, an access point, a personal computer, a game console, a television, a vehicle, an infotainment system, an in-vehicle electronic control unit (ECU), a set-top box, or any combination thereof) or a cloud device 30 (such as a server) that executes the second partitioned artificial neural network.

The wireless channel 502 used for communicating between the wireless headphone device 500 and the host device 504 provides the first and/or second communication channel 130, 230.

The headphones may be any suitable type of headphones. They may for example be on-ear, in-ear or over-the-ear headphones.

The host device 504 may be any suitable apparatus. It may for example be a smartphone, a server or any device with a processing unit for example.

In this example the headphone device 500 comprises one or more loudspeakers 506 one or more microphones 420, and/or other sensors 420, that capture input data 422 that is transmitted as data 40 through the partitioned artificial neural network associated with the current mode of operation. The artificial neural network is partitioned by the wireless communication channel 402. In the first mode of operation, the first partitioned artificial neural network 100 is used for transmitting the audio data, whereas in the second mode of operation the second partitioned artificial neural network 200 is used to transmit the audio data.

Figure 7A:
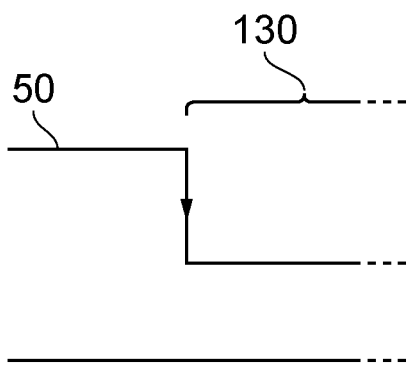
FIG. 7A shows another example embodiment of the subject matter described herein.
Figure 7B:
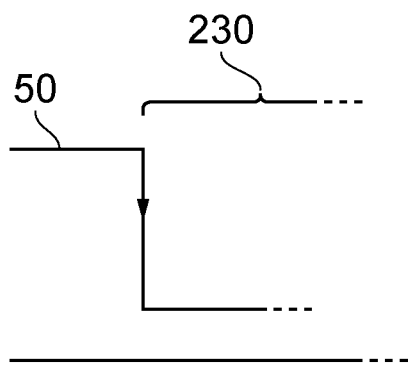
FIG. 7B shows an example embodiment of the subject matter described herein.

FIGS. 7A and 7B are an illustrative example of the different effect of using the first mode 302 and the second mode 304 on compression. FIG. 7A and FIG. 7B illustrate mode-dependent compression of a bandwidth 50. The bandwidth illustrates data transfer per second e.g. bits/s.

FIG. 7A illustrates that, in this example, the bandwidth 50 is significantly decreased for transmission across the first communication channel 130 by the first part 110 of the first artificial neural network 100. FIG. 7B illustrates that the bandwidth 50 is also significantly decreased by the first part 210 of the second artificial neural network 200 before transmission via the second communication channel 230. It can be appreciated from the differences between FIGS. 7A and 7B that the compression of data applied in the first mode 302 (FIG. 7A) and in the second mode 304 (FIG. 7B) is different.

The first artificial neural network 100 is configured to perform a first compression on the data 40 in the first mode 302 and the second artificial neural network is configured to perform a second compression on the data 40 in the second mode 304, different to the first compression.

In some but not necessarily all examples, the first compression is a compression for a first communications protocol. Additionally or alternatively, the first compression may also be optimized for the first predetermined task performed at the receiver device 30.

In some but not necessarily all examples, the second compression is a compression for a second communications protocol. Alternatively or additionally, the compression may also be for a second predetermined task performed at the receiver device 30.

For example, the first compression and/or the second compression may be used to create a stream of the data 40. In some examples, this stream may be a serial bit stream.

In some examples, the first mode may be associated with a particular communications protocol such as a Bluetooth (BT) or Bluetooth Low Energy (BLE) serial protocol and the second mode of operation may be associated with a different wireless communications protocol.

The first compression and/or the second compression may be configured to enable a particular quality of audio. For example, the quality of audio retained by the first compression may be better than the quality of audio retained by the second compression.

Other aspects of the protocol may be determined in addition to the bandwidth. For example the bit stream length or the modulation used may be defined by the communications protocol.

Figure 8A:
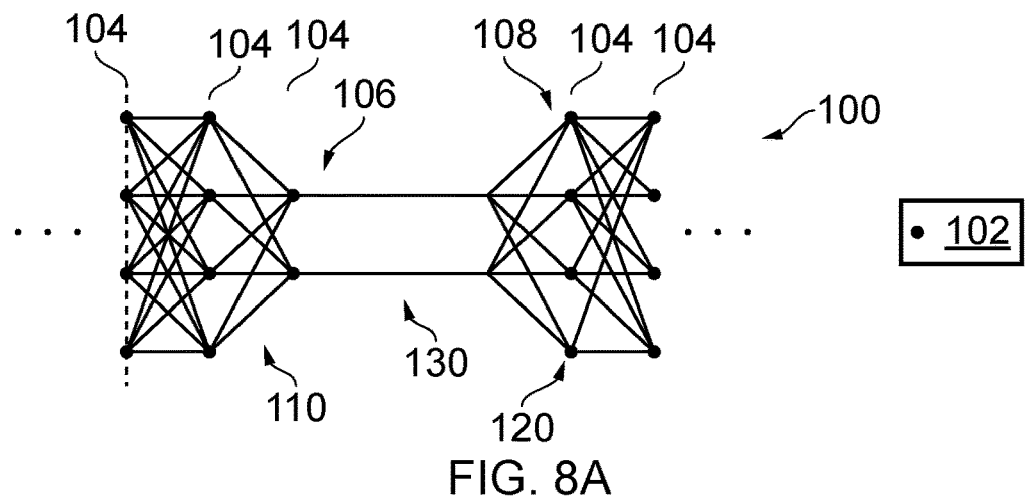
FIG. 8A shows another example embodiment of the subject matter described herein.
Figure 8B:
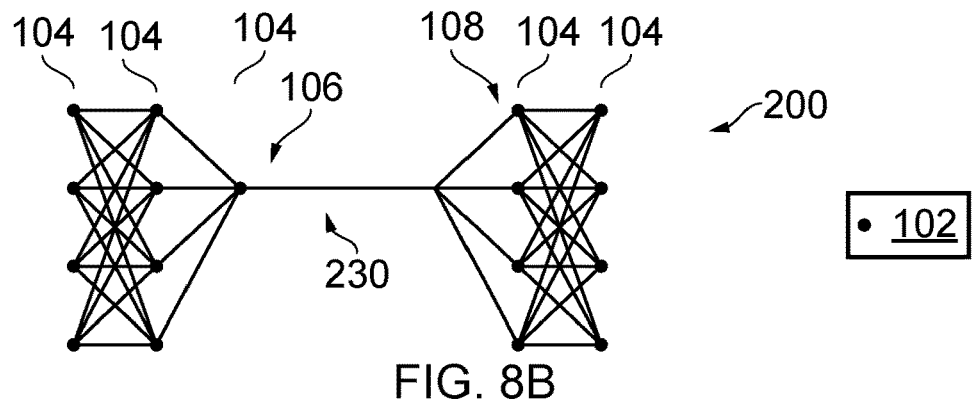
FIG. 8B shows an example embodiment of the subject matter described herein.

FIGS. 8A and 8B schematically illustrates an example of how the partitioned artificial neural network 100 used changes when the mode of operation changes. FIG. 8A illustrates a first partitioned artificial neural network 100 and FIG. 8B illustrates a second partitioned artificial neural network 200.

The artificial neural networks (ANN) 100, 200 comprise a number of highly interconnected processing elements (artificial neurons 102) that process information by their dynamic state response to inputs. The artificial neural network is arranged as a directed graph whose nodes are artificial neurons 102 and whose vertices are connections between artificial neurons.

Each artificial neuron 102 can be configured to determine whether or not a weighted sum of its inputs causes an activation function to produce an output. This is a layered ANN. An input layer is the first (leftmost) layer and receives at least some of its inputs from outside the ANN and an output layer is the final (rightmost) layer and provides at least some of its outputs outside the ANN. The layers between the first and final layer are hidden layers 104. For artificial neurons 102 in the hidden layer(s) 104 and the final layer, the inputs are outputs from the artificial neurons in the preceding layer. Thus each of these artificial neurons 102 determines whether or not a weighted sum of its inputs causes an activation function to produce an output.

Referring to FIG. 8A, the first part 110 of the artificial neural network 100 is separated from the second part 120 of the artificial neural network 100 by a first communication channel 130.

A hidden part 106, which in this example is a final hidden layer 104, of the first part 110 of the first artificial neural network 100 is dependent upon a bandwidth of the first communication channel 130 and/or is dependent upon a communications protocol used for communicating via the first communication channel 130.

In the example illustrated the first part 110 of the first artificial neural network 100 has a first hidden part 106 (which may be a layer or layers 104) that, in use, provides data 40 to the first communication channel 130. The second part 120 of the first artificial neural network 100 has a second hidden part 108 (in a layer or layers 104) that, in use, receives data 40 from the first communication channel 130.

The number of artificial neurons 102 in the first part 110, in this example, is dependent upon a bandwidth of the first communication channel 130. In particular, in the example illustrated, the number of neurons in the final hidden layer 106 of the first part 110 of the first artificial neural network 100 is dependent upon a bandwidth of the first communication channel 130.

Referring to FIG. 8B, the first part 210 of the artificial neural network 200 is separated from the second part 220 of the artificial neural network 100 by a second communication channel 230.

A hidden part 106, which in this example is a final hidden layer 104, of the first part 210 of the second artificial neural network 200 is dependent upon a bandwidth of the second communication channel 230 and/or is dependent upon a communications protocol used for communicating via the second communication channel 230.

In the example illustrated the first part 110 of the first artificial neural network 100 has a first hidden part 106 (which may be a layer or layers 104) that, in use, provides data 40 to the first communication channel 130. The second part 120 of the first artificial neural network 100 has a second hidden part 108 (in a layer or layers 104) that, in use, receives data 40 from the first communication channel 130.

The number of artificial neurons 102 in the first part 210, in this example, is dependent upon a bandwidth of the second communication channel 230. In particular, in the example illustrated, the number of neurons in the final hidden layer 106 of the first part 210 of the second artificial neural network 200 is dependent upon a bandwidth of the second communication channel 230.

It will be understood by those skilled in the art that by placing a constraint on the number of neurons 102 present at the final hidden layer 106 of the first part 110 of the partitioned artificial neural network, the quantity of data provided via the communication channel 130 is controlled.

As previously described, the number of neurons 102 in the final hidden layer 106 may be determined by the particular communications protocol used for the first communication channel 130. Similarly, the precisions used in the representation of the output of the final hidden layer 106 can be adjusted by the skilled practitioner to the bandwidth and accuracy requirements.

It will be appreciated by those who are skilled in the art that it is necessary to train an artificial neural network so that it operates as expected. Typically weights for the combination of inputs need to be assigned at each artificial neuron 101. One option for performing this optimization is by using gradient descent. It is for example possible to forward-propagate training data 40 through the artificial neural network and then back-propagate an error signal produced by supervised learning to produce weight updates. However, the back-propagation algorithm requires the determination of a localized cost function and a gradient of that cost function. It is therefore desirable to use a cost function that is differentiable. However, any non-differentiable cost function in a continuous landscape, can be made differentiable by approximation. For example, the function sign(x) can be replaced by either tan h(cx) for c>0 or a piecewise linear function.

The first part 110 of the first artificial neural network 100 and the second part 120 of the first artificial neural network are jointly trained as a single artificial neural network. This may, for example, be achieved by using back-propagation and a static or differentiable model of the communications channel 130. A differentiable model of the channel should be understood to be inclusive—any model can be made differentiable by simply inventing gradients. For example, modelling the channel as the identity function, produces as a gradient the identity.

Learning a model for the channel could be part of the implementation of the system. If so, those gradients could be learned as well, since the learning process can involve fitting a differentiable function (from a family F) to the channel. Differentiable can be understood in the following way: The output of the channel is a random variable Y depending on an "input" X. dY/dX, in direction t may be the expected value of Y(X+t)−Y(X), which a large enough function family F will eventually capture during training.

Supervised learning may be used to train the weight of the first artificial neural network 100 by using training data that defines an expected performance, for example, an expected performance in relation to the first predetermined task. In this way the first artificial neural network can learn when the first predetermined task should or should not be performed in response to input data 422.

The first part 210 of the second artificial neural network 200 and the second part 220 of the second artificial neural network 200 are jointly trained as a single artificial neural network. This may, for example, be achieved by using back-propagation and a static or differentiable model of the communications channel 230.

Supervised learning may be used to train the weight of the second artificial neural network 200 by using training data that defines an expected performance, for example, an expected performance in relation to the second predetermined task. In this way the second artificial neural network can learn when the second predetermined task should or should not be performed in response to input data 422.

In some, but not necessarily all, examples, the first part 110 of the first artificial neural network 100 and the second part 120 of the first artificial neural network 100 are jointly trained as a single artificial neural network to compensate for errors arising in the first communication channel 130. Besides the weights, the routing of information throughout the pipeline has a large impact on errors which are correlated, such as packet loss. Interleaving can be used at the transmission part of the pipeline, and can be thought of as part of the design of the architecture. Thus a single pipeline can provide both compression and built-in error correction that corrects for bit errors and dropped packets during transmission.

Information reordering could also be learned from data; either by brute force by doing black box optimisation (or a random search) across a set of possible architectures, or by describing a set of changes that the system is allowed to perform to the architecture based on physical measurements of the whole system
historical metrics of transmission quality
This can be used to formulate either
1) a heuristic optimisation
2) a reinforcement learning task which can effectively explore a non-differentiable, discrete landscape, and could potentially generalise across channel and task types.

The latter can be implemented by using a Markov decision process that consists of:
Set S of states s
Set A of actions a for every state s in S
Reward function R that depends on a triplet of state s, action taken a and the following state (if the state transition is not deterministic given a).
Here
S=a description of the current architecture, encoded into e.g. one-hot vectors
A=modifications that can be done to the architecture, e.g. permute bits
R=measure of the performance of the entire pipeline, possibly after retraining the network.

In some examples this optimisation can be done at runtime to create an adaptive communications channel.

The transmission noise can be modelled during training by adding a noise distribution during the training process to model transmission errors. The noise can either be ignored during the back-propagation or a synthetic gradient can be used.

An advantage to this approach is that because the trained task output is robust to transmission noise, separate error correction can be omitted.

Figure 9A:
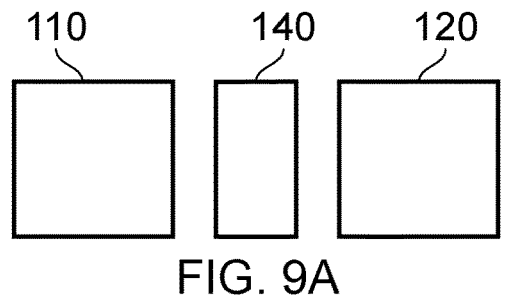
FIG. 9A shows another example embodiment of the subject matter described herein.
Figure 9B:
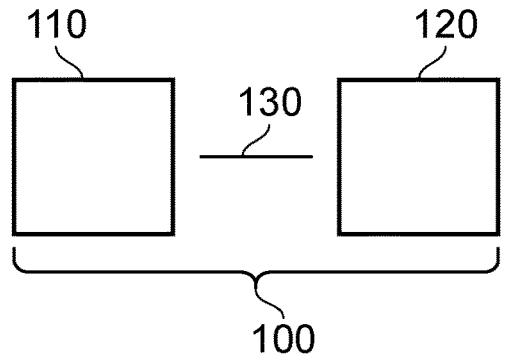
FIG. 9B shows an example embodiment of the subject matter described herein.

An alternative approach is to model the first communication channel 130 using an intermediate artificial neural network 140 during the joint training of the first part 110 and the second part 120 of the first joint network. This is schematically illustrated in FIG. 9A and FIG. 9B. In this example, the first part 110 of the first artificial neural network 100, the second part 120 of the first artificial neural network 100 and a first intermediate artificial neural network 140 positioned between the first part 110 of the first artificial neural network 100 and the second part 120 of the first artificial neural network 100 are simultaneously and jointly trained. The first intermediate artificial neural network 140 simulates errors arising from the first communication channel 130. The first part 110, second part 120 and the first intermediate artificial neural network 140 are jointly trained as a single artificial neural network to compensate for errors arising in the first communication channel 130 as illustrated in FIG. 9A. In implementation, the first part 110 of the first artificial neural network 100 and the second part 120 of the first artificial neural network 100, but not the first intermediate artificial neural network 140, are used as the first artificial neural network 100 as illustrated in FIG. 9B.

Figure 10A:
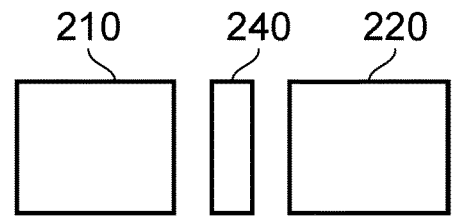
FIG. 10A shows another example embodiment of the subject matter described herein.
Figure 10B:
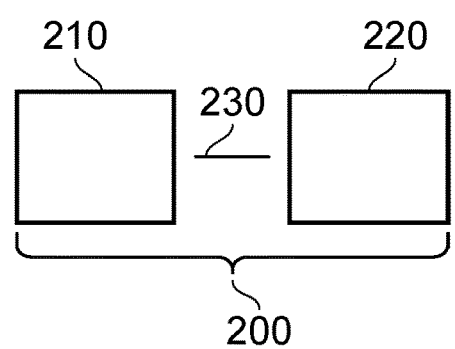
FIG. 10B shows an example embodiment of the subject matter described herein.

The second communication channel 230 can be modelled using an intermediate artificial neural network 240 during the joint training of the first part 210 and the second part 220 of the second network 100. This is schematically illustrated in FIG. 10A and FIG. 10B. In this example, the first part 210 of the second artificial neural network 200, the second part 220 of the second artificial neural network 200 and a second intermediate artificial neural network 240 positioned between the first part 210 and the second part 220 are simultaneously and jointly trained. The second intermediate artificial neural network 240 simulates errors arising from the second communication channel 230. The first part 210, second part 220 and the second intermediate artificial neural network 240 are jointly trained as a single artificial neural network to compensate for errors arising in the second communication channel 230 as illustrated in FIG. 10A. In implementation, the first part 210 and the second part 220, but not the second intermediate artificial neural network 240, are used as the first artificial neural network 100 as illustrated in FIG. 10B.

The intermediate artificial neural network 140, 240 models the channel as an artificial neural network comprising a set of layers with probabilistic and deterministic behavior. The whole combination of the first part 110,210 intermediate artificial neural network 140, 240 and second part 120, 220 is trained, for example, using stochastic gradient descent and back-propagation. After discarding the first intermediate artificial neural network 140,240 the artificial neural network 100, 200 may be additionally trained. During this training certain layers may have fixed weightings while other layers may be allowed to vary within certain limits. This can be used to fine-tune the response.

In the preceding examples, it is necessary to achieve synchronization between the transmitter device 110 and the receiver device 120. This can be achieved in a number of different ways. One way in which this can be achieved is by labelling or partitioning the input data 422 using pre-processing.

In the examples illustrated previously, the first part of the partitioned artificial neural network 100, 200 may be a recurrent artificial neural network and/or the second part of the partitioned artificial neural network 100, 200 may be a recurrent artificial neural network. The feedback present in a recurrent artificial neural network may for example be present within the first part, within the second part or be from the second part to the first part via the communication channel 130, 230.

In some, but not necessarily all, examples, the configuration of a partitioned artificial neural network 100, 200 may be dependent upon and adapted to computation limitations of the transmitter device 20 and/or the receiver device 30. For example, the size or configuration of the first part of the partitioned artificial neural network may be determined by processing or memory limitations in the transmitter device 20. The size or configuration of the second part of the partitioned artificial neural network 100, 200 may be constrained by the processing and/or memory available at the receiver device 30.

In the preceding text, reference is made to the performance of various different tasks. In some, but not necessarily all, examples, the predetermined task may be a task that is trained during training of the artificial neural network. In some but not necessarily all examples, it may relate to event detection. An event may, for example, be detection of a keyword, speech recognition or high quality encoding.

In some examples, the event detection may be used as a trigger to switch modes.

In a keyword detection mode, all sound input from the microphone(s) is compressed to a low bandwidth, sufficient for the task of recognition of a single phrase to activate the speech recognition mode but insufficient to enable speech recognition.

In the speech recognition mode, voice input from the microphone(s) 420 is compressed to a medium bandwidth so that speech to text is possible. This mode remains active until no more speech is detected.

In a high quality mode, the sound input at the microphone (s) 420 is encoded to a high quality (high bandwidth) so that the receiver device 30 is able to enable reproduction of the original audio with high fidelity.

Any one of these different modes may be for example the first mode of operation 302 previously described and any of the other modes may be for example the second mode of operation 304 previously described. It will therefore be appreciated that these different modes can be effected by using partitioned artificial neural networks 100, 200 as described. Furthermore, the transitions between the different modes may be enabled using the partitioned artificial neural networks. Furthermore, a system 2, 300 may have more than two nodes and related artificial neural network or machine learning algorithms.

Other examples of tasks that may be performed include detection in video of motion detected data 40, speech recognition or speaker identification from audio data 40 or providing video for streaming for playback, providing video or image streaming for object recognition, IMU and/or GPS sensor data for movement detection and/or analysis, providing LIDAR data for 3D model creation and/or object detection, PPG. Other examples of tasks may, for example, comprise lowering a volume of output audio, opening an acoustic valve, turning off active noise cancellation when aware of the headphones 500 is being spoken to, switching on high quality streaming from the microphone.

Figure 11:
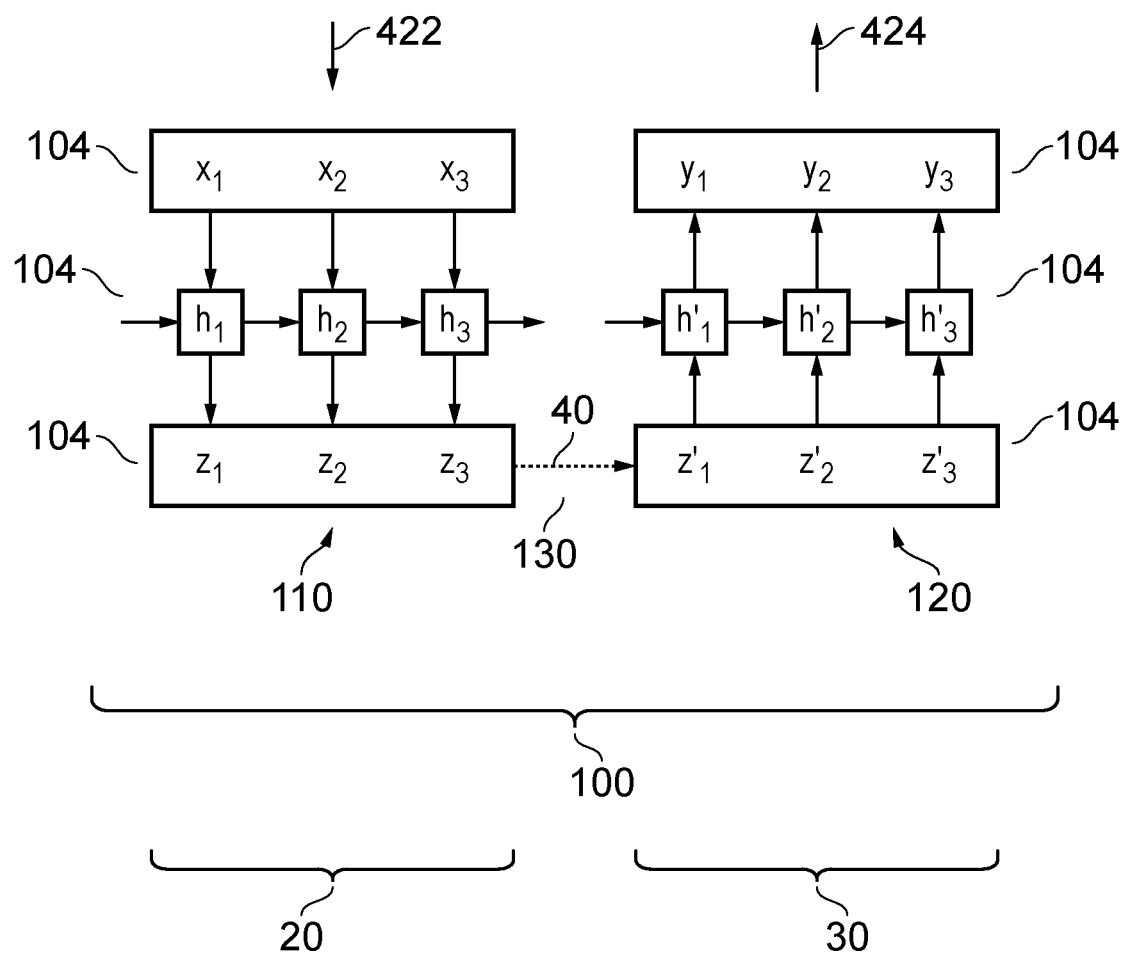
FIG. 11 shows an example embodiment of the subject matter described herein.

In one example embodiment, as illustrated in FIG. 11, the first part 110 of the first artificial neural network 100 receives as data 422 a signal $x_1$. It transmits onto the first communication channel 130 data 40 represented by $z_1 = h_1(x_1)$. The second part 120 of the first artificial neural network receives the transmitted data 40, $z'_1$, and maps the transmitted signal $z'_1$ to an output $y_1$, where $y_1 = h'_1(z'_1)$. In case of a RNN (Recurrent Neural Network), the n-steps $z_n = h_n(x_n)$ and $y_n = h'_n(z'_n)$, wherein $h_{n+1}$ and $h'_{n+1}$ are updated neural networks 110 and 120), are repeated as long as the neural network 110 receives the data 422. This output 424 is a task prediction. In some examples the value of z is quantized. Thus a context y is determined based on z from the first part 110 and also optionally from other input at the receiver device 30. In this example, the receiver device 30 makes the decision to change the context and causes the state transition from the first mode 302 to the second mode 304 based on this input. In some, but not necessarily all, examples, the receiver device 30 transmits this decision back to the transmitter device 20 as a special context changing code. This may, for example, be transmitted via a separate bandwidth wireless channel. In one example embodiment, the $h_1$ and $h'_1$ can be a first part and a second part of a partitioned neural networks. In another example embodiment, the $h_1$ and $h'_1$ can be different neural networks based on the capabilities of the respective devices 20 and 30. For example, the transmitter device 20 (or alternatively the receiver device 30) may have limited CPU, memory and/or power resources, and therefore runs shallow and/or smaller neural network with less hidden layers and/or neurons. Yet in another example embodiment, $h_1$ and $h'_1$ can be either artificial neural networks (ANN) or any other type of machine learning (ML) algorithms. such as a support vector machine, or a Bayesian network.

In other examples, the context may not be determined in this way but may be determined by user input or programmatically, possibly by inferring a context based on inputs from the transmitter device 20 and the receiver device 30.

In one example embodiment, the first part 110 of the first artificial neural network 100 receives as data 422 that is a pulse code modulated (PCM) encoded sound signal which is mapped to a bit string 40 whose length is determined by the Bluetooth Low Energy protocol used for transmission in the first communication channel 130. The second part 120 of the first artificial neural network receives the transmitted data 40. It is a recurrent artificial neural network configured for keyword recognition. The first part 110 and the second part 120 of the first artificial neural network 100 are trained simultaneously with stochastic gradient descent. The task prediction is trained to an output 1 if the data 422 represents an audio signal that is part of the keyword and 0 otherwise and maps the transmitted signal $z'_1$ to an output $y_1$, where $y_1 = h'_1(z'_1)$.

Where a structural feature has been described, it may be replaced by means for performing one or more of the functions of the structural feature whether that function or those functions are explicitly or implicitly described.

In some but not necessarily all examples, the apparatus 20, 30 is configured to communicate data from the apparatus 20, 30 with or without local storage of the data in a memory 404 at the apparatus 20, 30 and with or without local processing of the data by circuitry or processors at the apparatus 20, 30.

The data may, for example, be measurement data from or data produced by the processing of measurement data.

The data may be stored in processed or unprocessed format remotely at one or more devices. The data may be stored in the Cloud.

The data may be processed remotely at one or more devices. The data may be partially processed locally and partially processed remotely at one or more devices.

The data may be communicated to the remote devices wirelessly via short range radio communications such as Wi-Fi or Bluetooth, for example, or over long range cellular radio links. The apparatus may comprise a communications interface such as, for example, a radio transceiver for communication of data.

The apparatus 20, 30 may be part of the Internet of Things (IoT) forming part of a larger, distributed network.

The processing of the data, whether local or remote, may be for the purpose of health monitoring, data aggregation, patient monitoring, vital signs monitoring or other purposes.

The above described examples find application as enabling components of:
automotive systems; telecommunication systems; electronic systems including consumer electronic products; distributed computing systems; media systems for generating or rendering media content including audio, visual and audio visual content and mixed, mediated, virtual and/or augmented reality; personal systems including personal health systems or personal fitness systems; navigation systems; user interfaces also known as human machine interfaces; networks including cellular, non-cellular, and optical networks; ad-hoc networks; the internet; the internet of things; virtualized networks; and related software and services.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although embodiments have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain embodiments, those features may also be present in other embodiments whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer and exclusive meaning.

The presence of a feature (or combination of features) in a claim is a reference to that feature) or combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

I claim:

1. An apparatus comprising;
   at least one processor; and
   at least one memory including computer program code;
   the at least one memory and the computer program code configured to, with the at least one processor, cause the apparatus at least to perform;
   operate in a first mode of operation to enable performance of a first predetermined task to transfer data via a transmitter device to a receiver device across a first communication channel using a first artificial neural network, wherein the first artificial neural network is partitioned to the transmitter device and the receiver device, wherein in the first mode, the first artificial neural network is configured to perform a first compression on input data;
   operate in a second mode of operation to enable performance of a second predetermined task to transfer data via the transmitter device to the receiver device across a second communication channel using a second artificial neural network, wherein the second artificial neural network is partitioned to the transmitter device and the receiver device, wherein in the second mode, the second artificial neural network is configured to perform a second compression on input data; and
   determine to operate the apparatus in the first mode or the second mode, wherein the determination to operate the apparatus in the first mode is in response to use of a first wireless communications protocol over the first communication channel or to operate in the second mode is in response to use of a second wireless communications protocol over the second communication channel.

2. An apparatus as claimed in claim 1, further configured for mode-dependent compression, wherein the second compression on input data is different to the first compression, and wherein the first wireless communications protocol is different to the second wireless communications protocol.

3. An apparatus as claimed in claim 2, wherein the first wireless communications protocol is in accordance with a Bluetooth protocol and/or a Bluetooth Low Energy protocol.

4. An apparatus as claimed in claim 1, wherein a hidden part of a first part of the first artificial neural network is dependent upon a bandwidth of the first communication channel and/or is dependent upon a type of communications protocol used for communicating via the first communication channel.

5. An apparatus as claimed claim 1, wherein a first part of the first artificial neural network has a hidden part that in use provides data to the first communication channel, and wherein number of neurons in the hidden part is dependent upon a bandwidth of the first communication channel.

6. An apparatus as claimed in claim 1, wherein the input data comprises sensor data.

7. An apparatus as claimed in claim 1, wherein data input to the first artificial neural network and data input to the second artificial neural network is audio data from a same one or more microphones.

8. An apparatus as claimed in claim 1, further configured as a wireless headphone device or a device for communicating with a wireless headphone device.

9. An apparatus as claimed claim 1, wherein data transferred from a first part of the first artificial neural network across the first communication channel to a second part of the first artificial neural network is encoded by the first part of the first artificial neural network before transfer, and/or
   wherein data transferred from a first part of the second artificial neural network across the second communication channel to a second part of the second artificial neural network is encoded by the first part of the second artificial neural network before transfer.

10. A method comprising:
    determining to operate in a first mode to enable performance of a first predetermined task to transfer data via a transmitter device to a receiver device across a first communication channel using a first artificial neural network, wherein the first artificial neural network is partitioned to the transmitter device and the receiver device, wherein in the first mode, the first artificial neural network is configured to perform a first compression on input data;
    determining to operate in a second mode to enable performance of a second predetermined task to transfer data via the transmitter device to the receiver device across a second communication channel using a second artificial neural network, wherein the second artificial neural network is partitioned to the transmitter device and the receiver device, wherein in the second mode, the second artificial neural network is configured to perform a second compression on input data; and
    determining to operate an apparatus in the first mode or the second mode, wherein the determination to operate the apparatus in the first mode is in response to use of a first wireless communications protocol over the first communication channel or to operate in the second mode is in response to use of a second wireless communications protocol over the second communication channel.

11. A method as claimed in claim 10, further configured for mode-dependent compression, wherein the second compression on input data is different to the first compression, and wherein the first wireless communications protocol is different to the second wireless communications protocol.

12. A method as claimed in claim 11, wherein the first wireless communications protocol is in accordance with a Bluetooth protocol and/or a Bluetooth Low Energy protocol.

13. A method as claimed in claim 10, wherein a hidden part of a first part of the first artificial neural network is dependent upon a bandwidth of the first communication channel and/or is dependent upon a type of communications protocol used for communicating via the first communication channel.

14. A method as claimed claim 10, wherein a first part of the first artificial neural network has a hidden part that in use provides data to the first communication channel, and wherein number of neurons in the hidden part is dependent upon a bandwidth of the first communication channel.

15. A method as claimed in claim 10, wherein the input data sensor data.

16. A method as claimed in claim 10, wherein data input to the first artificial neural network and data input to the second artificial neural network is audio data from a same one or more microphones.

17. A method as claimed in claim 10, further configured to perform in a wireless headphone device or a device for communicating with a wireless headphone device.

18. A method as claimed claim 10, wherein data transferred from a first part of the first artificial neural network across the first communication channel to a second part of the first artificial neural network is encoded by the first part of the first artificial neural network before transfer, and/or
wherein data transferred from a first part of the second artificial neural network across the second communication channel to a second part of the second artificial neural network is encoded by the first part of the second artificial neural network before transfer.

19. A non-transitory computer readable medium comprising program instructions for causing an apparatus to perform at least the following;
determining to operate in a first mode to enable performance of a first predetermined task to transfer data via a transmitter device to a receiver device across a first communication channel using a first artificial neural network, wherein the first artificial neural network is partitioned to the transmitter device and the receiver device, wherein in the first mode, the first artificial neural network is configured to perform a first compression on input data;
determining to operate in a second mode to enable performance of a second predetermined task to transfer data via the transmitter device to the receiver device across a second communication channel using a second artificial neural network, wherein the second artificial neural network is partitioned to the transmitter device and the receiver device, wherein in the second mode, the second artificial neural network is configured to perform a second compression on input data; and
determining to operate an apparatus in the first mode or the second mode, wherein the determination to operate the apparatus in the first mode is in response to use of a first wireless communications protocol over the first communication channel or to operate in the second mode is in response to use of a second wireless communications protocol over the second communication channel.

20. An apparatus comprising;
at least one processor; and
at least one memory including computer program code;
the at least one memory and the computer program code configured to, with the at least one processor, cause the apparatus at least to perform;
operate a receiver device in a first mode of operation to enable performance of a first predetermined task by using, at the receiver device, a second part of a first partitioned artificial neural network to receive data at the receiver device from a first part of the first partitioned artificial neural network, wherein in the first mode, the first artificial neural network is configured to perform a first compression on input data;
operate the receiver device in a second mode of operation to enable performance of a second predetermined task by using, at the receiver device, a second part of a second partitioned artificial neural network to receive data at the receiver device from a first part of the second partitioned artificial neural network, wherein in the second mode, the second artificial neural network is configured to perform a second compression on input data; and
determine to operate in the first mode or the second mode, wherein the determination to operate the apparatus in the first mode is in response to use of a first wireless communications protocol over the first communication channel or to operate in the second mode is in response to use of a second wireless communications protocol over the second communication channel.

* * * * *